(12) United States Patent
Pendharker et al.

(10) Patent No.: US 7,164,160 B2
(45) Date of Patent: Jan. 16, 2007

(54) INTEGRATED CIRCUIT DEVICE WITH A VERTICAL JFET

(75) Inventors: Sameer P. Pendharker, Dallas, TX (US); Pinghai Hao, Plano, TX (US); Xiaoju Wu, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 77 days.

(21) Appl. No.: 10/678,028

(22) Filed: Sep. 29, 2003

(65) Prior Publication Data

US 2005/0067631 A1    Mar. 31, 2005

(51) Int. Cl.
*H01L 29/74*    (2006.01)
*H01L 31/111*    (2006.01)

(52) U.S. Cl. ........................ 257/134; 257/135

(58) Field of Classification Search ........ 257/134–135, 257/256, 302

See application file for complete search history.

(56) References Cited

U.S. PATENT DOCUMENTS 4,338,618 A * 7/1982 Nishizawa .................. 257/264
4,404,575 A * 9/1983 Nishizawa .................. 257/264
6,657,255 B1 * 12/2003 Hshieh et al. .............. 257/330

OTHER PUBLICATIONS

Pending U.S. Appl. No. 10/623,230, Howard et al. "Double Diffused Vertical JFET".
Pending U.S. Appl. No. 10/614,840, Howard et al. "Implant-Controlled-Channel Vertical JFET".

* cited by examiner

*Primary Examiner*—Theresa T. Doan
(74) *Attorney, Agent, or Firm*—Yingsheng Tung; Wade James Brady, III; Frederick J. Telecky, Jr.

(57) ABSTRACT

We disclose the structure of a JFET device, the method of making the device and the operation of the device. The device is built near the top of a substrate. It has a buried layer that is electrically communicable to a drain terminal. It has a channel region over the buried layer contacting gate regions that connect to a gate terminal. The channel region, of which the length spans the distance between the buried layer and a source region, is connected to a source terminal. The device current flows in the channel substantially perpendicularly to the top surface of the substrate.

10 Claims, 3 Drawing Sheets

INTEGRATED CIRCUIT DEVICE WITH A VERTICAL JFET

BACKGROUND OF THE INVENTION

This invention relates to semiconductor devices and particularly to an improved junction field effect transistor (JFET).

A conventional JFET is a three-terminal semiconductor device in which a current flows substantially parallel to the top surface of the semiconductor chip and the flow is controlled by a vertical electric field, as shown in FIGS. 1a, 1b, and 1c. It can be used as a current switch or a signal amplifier.

JFETs are known as unipolar transistors because the current is transported by carriers of one polarity, namely, the majority carriers. This is in contrast with bipolar junction transistor, in which both majority-and-minority-carrier currents are important.

A typical n-channel JFET fabricated by the standard planar process is shown in FIG. 1. FIG. 1a depicts an n-channel JFET of which the channel is a part of an epitaxial semiconductor layer. FIG. 1b depicts another n-channel JFET of which the channel is formed with a double-diffusion technique in a semiconductor substrate. FIG. 1c is a schematic representation of the JFETs.

As depicted in FIGS. 1a and 1b, the body of the JFET comprises a lightly doped n-type channel sandwiched between two heavily doped $p^+$-gate regions. In FIG. 1a, the lower $p^+$ region is the substrate, and the upper $p^+$ region is a portion of the silicon epitaxial layer into which boron atoms are diffused. The two $p^+$ regions may be connected either internally or externally to form the gate terminal. Ohmic contacts are attached to the two ends of the channel to form the drain and source terminals through which the channel current flows. Alternatively, as illustrated in FIG. 1b, a JFET may be fabricated by a double-diffusion technique where the channel is formed by diffusing n-type dopant into the substrate. In both cases, the channel and the gate regions run substantially parallel the top surface of the substrate, so does the current flow in the channel. The operation of a JFET in a switching mode is briefly described in the next paragraph.

When the gate voltage is close to the channel potential, mobile charge carriers flow freely in the channel region between the source and the drain terminals. This is the ON state. To reach the OFF state, one may apply a reverse-biasing voltage to the gate terminals. The reverse bias voltage applied across the gate-channel junctions "pinches off" the channel by depleting mobile charge carriers from the channel and produces space-charge regions that extend across the entire width channel.

With the gate voltage set between ON and OFF levels, the effective cross-sectional area of the channel can be varied and so can the channel resistance to the current flow. Thus the current flow between the source and the drain is modulated by the gate voltage.

An important figure of merit of a JFET is its cutoff frequency ($f_{co}$), which can be represented mathematically as follows:

$$f_{co} \leq q\alpha^2 \mu_n N_d / (4\pi k \in_o L^2),$$

where q is the electric charge of the charge carriers, $\alpha$ is the channel width, $\mu_n$ is the mobility of the charge carriers, $N_d$ is the doping concentration in the channel, k and $\in_o$ are the dielectric constant of the semiconductor material and the electrical permittivity of the free space respectively, and L is the channel length.

Another important figure of merit of a JFET is the noise figure. One dominant noise source in a transistor is the interaction of the mobile charge carriers and crystal imperfections in the device. This gives rise to the 1/f noise spectrum.

This invention provides a JFET device that has superior $f_{co}$ and 1/f performance over conventional JFETs and a process of making the device.

DESCRIPTION OF THE PREFERRED EMBODIMENT

Applicants recognize that, due to traditional wafer processing, the top surface of a semiconductor substrate is usually heavily populated with imperfections such as dangling bonds and charge traps. Interactions between the mobile charge carriers in the substrate and the surface imperfections limit the performance of semiconductor devices in which the current flows parallel and close to the top surface of the substrate. This invention meliorate the limitations by forming a device that has a "vertical" channel, that is, a channel that runs substantially perpendicular to the top surface of the substrate and in which the current flows substantially away from the top surface of the substrate.

In this configuration, the interaction between the charge carrier and the surface imperfection is substantially reduced, which enables the device to have superior cutoff frequency ($f_{co}$) and 1/f noise figure.

Figure 2:
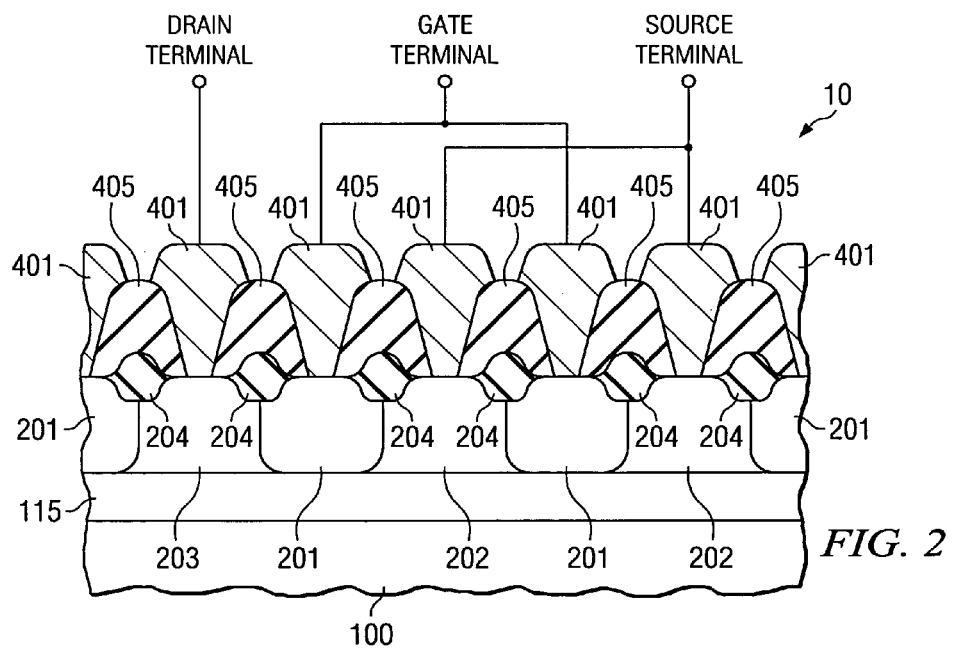
FIG. 2 depicts a partial sectional depiction of a JFET embodying the invention built in a semiconductor substrate.

FIG. 2 depicts a partial sectional depiction of a semiconductor substrate with a JFET embodying the invention built in it. In this embodiment, substrate 100 is p-type silicon wafer. Note that a JFET may be built on substrate of other group IV elements or compound semiconductor materials such as gallium arsenide and mercury telluride. The substrate may be mono-crystalline or poly-crystalline. It may be a bonded wafer where a layer of insulator is bonded to layers of semiconductor material.

Layer 115 is an n-type buried layer (NBL), which is usually a heavily doped, mono-crystalline silicon layer. The NBL serves as low-resistance current path between the channel region and the drain plug. The channel region and the drain plug will be discussed in a later section. In a high-performance bipolar or BiCMOS integrated-circuit chip, an NBL is usually present for other circuit considerations. Note that a second, p-type buried layer may be incorporated atop the NBL for building a p-type JFET in a p-type substrate. In many circuit applications, having a complementary pair of JFETs is advantageous. The complementary p-type JFET may also be built directly on the substrate without a buried layer. In such case, the p-substrate serves as the current path between the channel and the drain. The various JFET components are described in more detail in the next paragraphs in connection with layer 200.

Figure 1A:
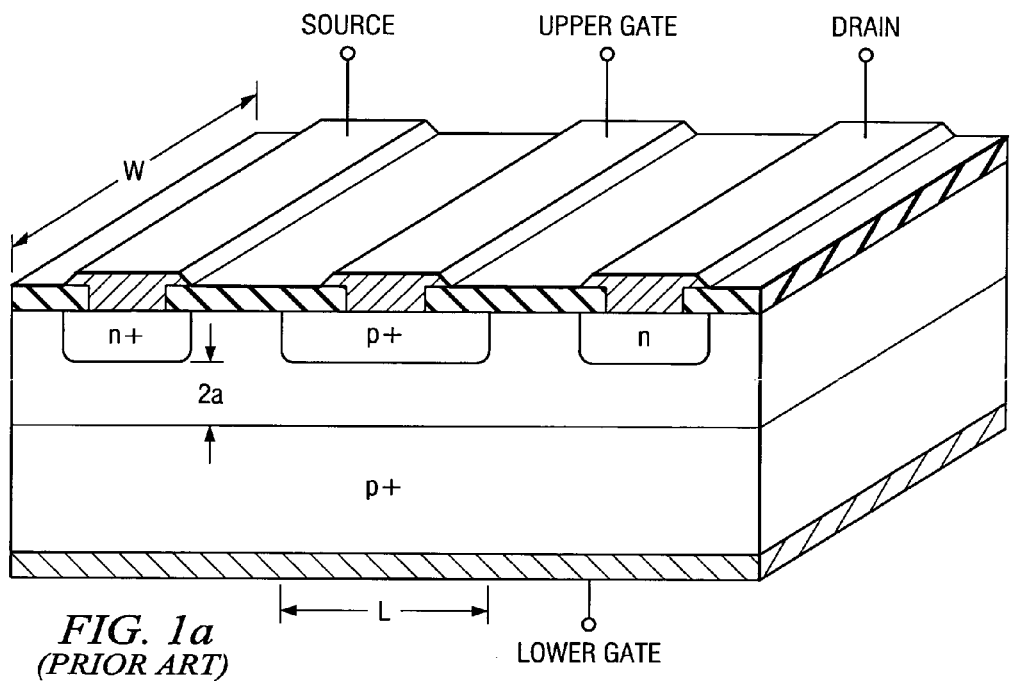
FIG. 1a depicts a partial sectional depiction of a JFET device built in a semiconductor substrate.
Figure 1B:
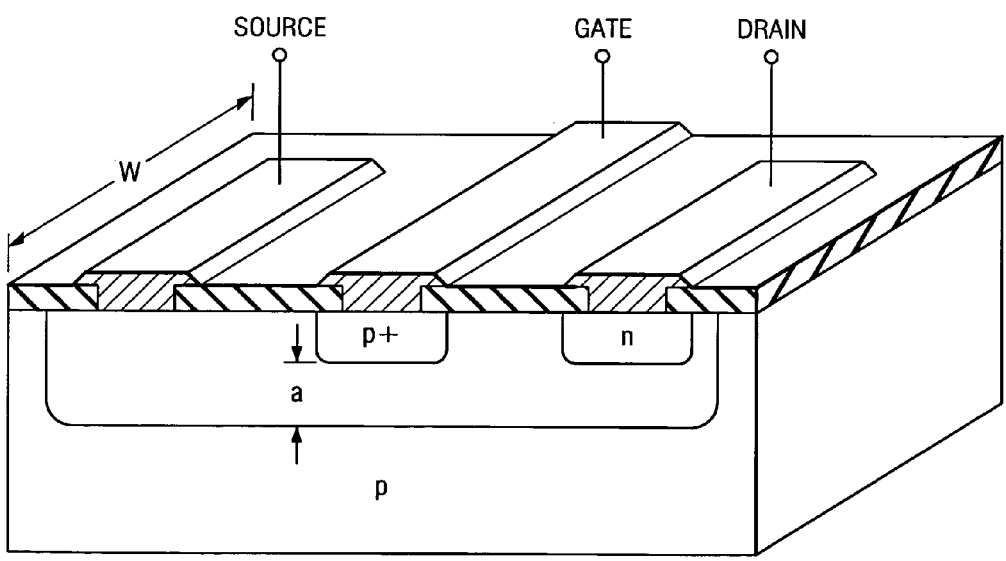
FIG. 1b depicts a partial sectional depiction of another JFET device built in a semiconductor substrate.
Figure 1C:
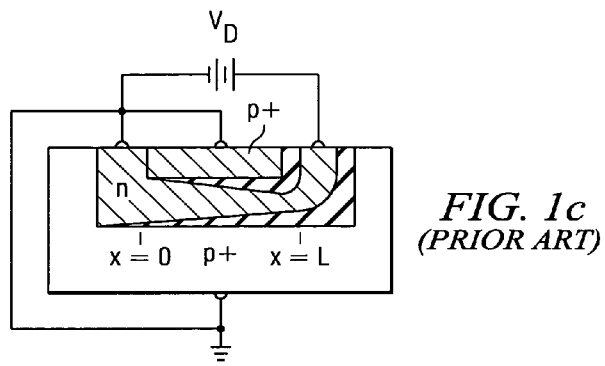
FIG. 1c depicts a schematic representation of a JFET in FIG. 1a or 1b.

Layer 200 in this embodiment is a mono-crystalline silicon layer. It contains gate regions 201, channel regions 202 and a drain region 203. The regions are electrically isolated from each other by dielectric elements 204 and are communicable to other circuit elements of an integrated circuit through metallic leads 401. The metallic leads are mutually insulated from each other where needed by dielectric elements 405. FIG. 1 depicts two gate regions joined electrically by metallic leads 401 which lead to the gate terminal. Similarly, a drain region and source regions are made communicable to the external drain- and source-terminal by a metallic leads 401. The channel regions are designed to have a impurity-doping profile such that their effective width may be readily modulated with varying voltage biasing at the gate terminal. The elements in layer 200 will be discussed in more detail in the following paragraphs.

In FIG. 2, the channel regions 202 and the drain region 203 are doped with n-type dopant, the same doping polarity as that in the NBL. The gate regions 201 are doped with the opposite, p-type dopant. Therefore, there exits a p-n junction at the intersection between the NBL 115 and the individual gate regions 201, while the intersections between the NBL 115 and the channel regions 202 and drain region 203 will be ohmic. In this embodiment, the entire layer 200 is mono-crystalline. Note that a JFET may also be built with poly-crystalline material in the gate, drain and channel regions although mono-crystalline material tends to have some physical properties such as charge carrier mobility that are superior to those associated with polycrystalline material.

The doping of the various regions may be by ion-implant technique, diffusion technique, or other techniques known in the art of semiconductor processing. In this embodiment, the NBL 115 is heavily doped, so is the drain region 204. The channel regions 202 are generally doped more lightly than the gate regions. This is to facilitate the modulation of the effective channel width with a gate voltage. In this embodiment, all electrical wirings are disposed near the top surface of the substrate. Not shown in FIG. 2 are regions of silicidation, which are commonly employed in the art for reducing the contact resistance between the semiconductor material and the metallic leads 401. Refractory metals such as nickel, titanium and cobalt are commonly employed in the silicidation process. The process of building the n-channel JFET is described in more detail in the following paragraphs with the aid of FIGS. 3–6.

Figure 3:
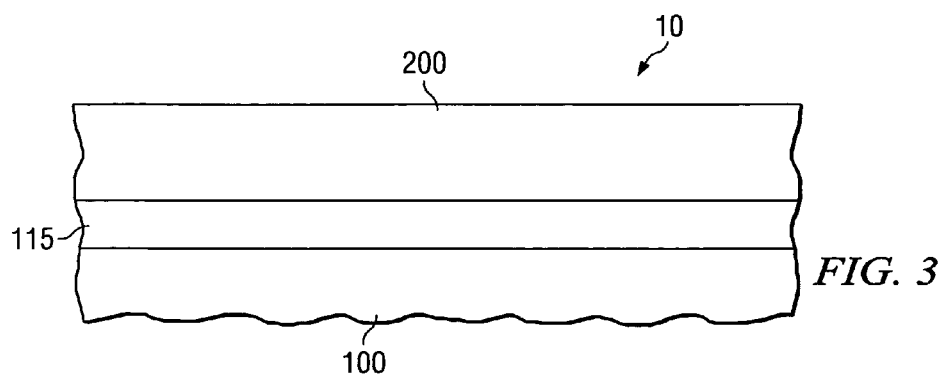
FIG. 3 depicts a cross-sectional depiction of a partially completed JFET 10 embodying this invention.

FIG. 3 depicts a cross-sectional depiction of a partially completed JFET 10 embodying this invention. Specifically, FIG. 3 depicts the three elements: the substrate 100, the NBL 115 and the layer 200. In this embodiment, substrate layer 100 is a silicon wafer. Other materials that may be used to implement this invention include germanium and other Group IV elements, compound semiconductors such as gallium arsenide, mercury telluride, and germanium doped silicon. Layer 100 in this embodiment is mono-crystalline. This invention may be implemented with other crystalline forms such as poly-crystalline. This invention may also be implemented with a bonded wafer such as silicon-on-insulator (SOI) wafer.

The n-type buried layer (NBL) 115 is a heavily doped silicon layer. This layer forms a p-n junction to the substrate layer 100 for electrically insulating the JFET from the substrate. NBL may be formed by an ion-implant technique where n-type ions are implanted in a p-type substrate. It may also be formed by an epitaxial-growth technique where a layer of silicon is deposited while it is doped.

In certain circuit application, this insulation may not be necessary. In such case, the NBL may be left out from the JFET structure. For example, when certain circuit application calls for a p-type JFET that may be electrically connected by the substrate, the p-type JFET may be formed in a p-type substrate without a buried layer. The channel, the source, the drain, and the gate regions of the JFET are formed in a layer 200 above the buried layer, projected outward from the top surface of the substrate 100.

Figure 4:
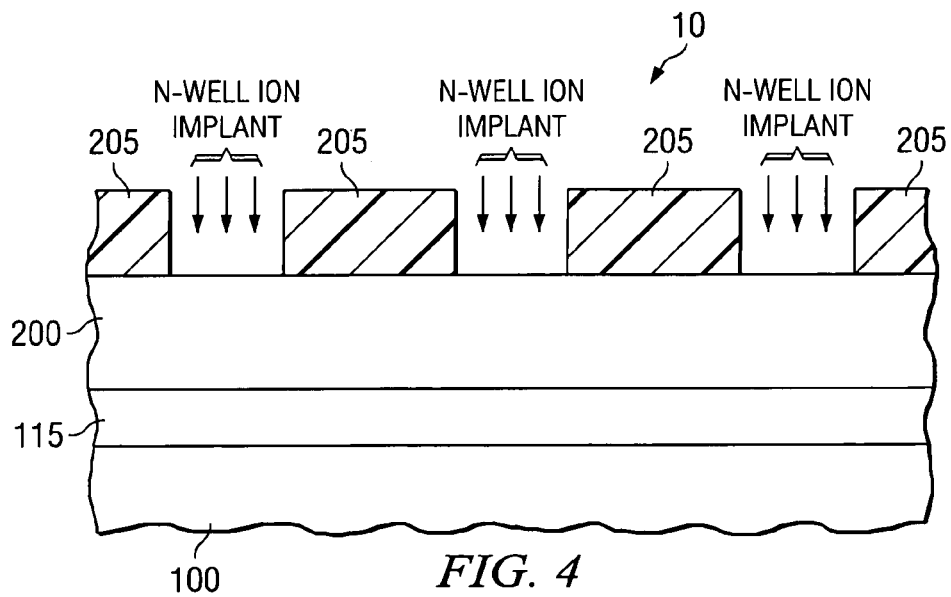
FIG. 4 depicts a cross-sectional depiction of a further partially completed JFET 10 embodying this invention.

FIG. 4 depicts an ion-implant process for forming the drain region and the channel region. Elements 205 depict a photoresist pattern. The purpose of this pattern is to provide a shielding for blocking the ions from entering a certain region in the layer 200. In this embodiment, the surface areas atop the channel regions 202 are uncovered by the photoresist pattern 205. The distance "d" is the designed width of the channel region. The channel width is one of the design parameters of the JFET. With a given ion-implant procedure, the channel width controls the gate biasing voltage that pinches off the effective channel width. The minimum designed-channel-width depends on the lithographic capability of a given process node. As the processing technique advances towards decreasing feature sizes, the minimum channel-width decreases accordingly.

In this embodiment, the channel doping profile is set with the aid of an extrinsic n-type ion-implant step. When the n-type JFET is one of the circuit components of a CMOS or BiCMOS integrated circuit, the channel implant may be the same as the n-well implant, which is common in a CMOS or BiCMOS process. Note that this invention may be implemented without an extrinsic n-type ion-implant if the economic consideration allows for choosing a proper concentration that is intrinsic in layer 200. This invention may also be implemented by combining the intrinsic epi-doping, the n-well implant and the p-well implant to set the final doping profile in the channel regions 202. The p-well doping is discussed in the next paragraph.

Figure 5:
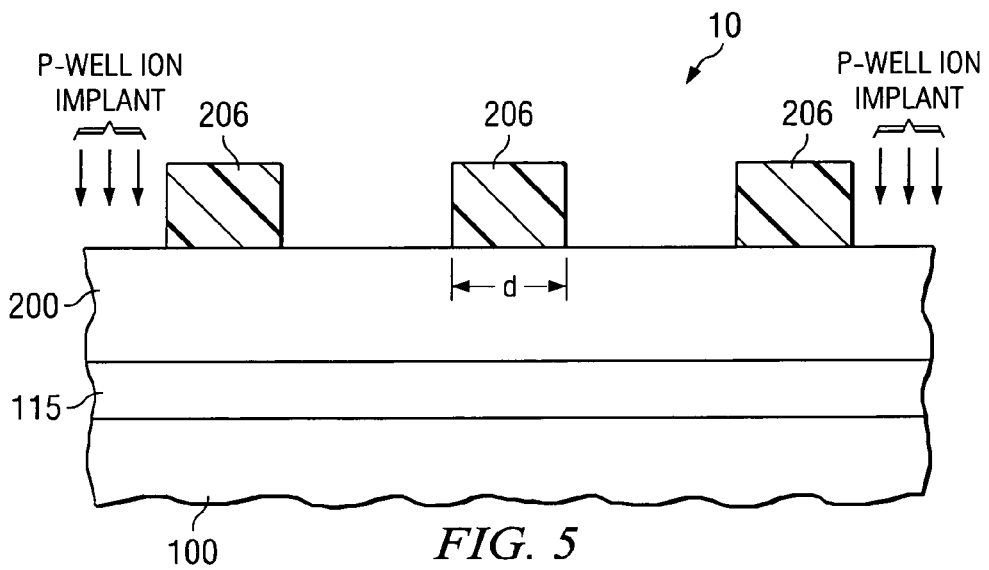
FIG. 5 depicts a cross-sectional depiction of a further partially completed JFET 10 embodying this invention.

FIG. 5 depicts a p-type ion-implant step in forming an n-type JFET embodying this invention using a photoresist pattern 206. This implant sets the doping profile in the gate regions 201. When the JFET is fabricated in a CMOS or a BiCMOS process, the p-well implant may be adequate to set the proper doping profile in the gate regions 201. Otherwise, a dedicated p-type ion implant may be used to dope the gate regions 201. After the ion-implant steps are performed, the dopants are redistributed in the various regions with thermal process. The result is depicted in FIG. 6.

Figure 6:
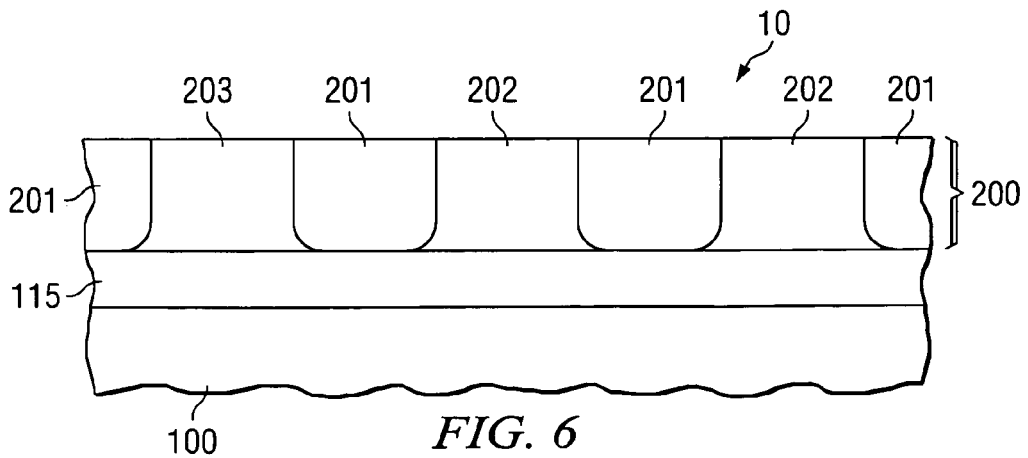
FIG. 6 depicts a cross-sectional depiction of a further partially completed JFET 10 embodying this invention.

FIG. 6 depicts the boundaries between various regions of the n-type JFET. In this embodiment, there is a NBL, which is heavily doped with n-type dopant. The channel regions 202 is also predominately n-type. Therefore, the boundary between the channel regions 202 and the NBL is ohmic and presents little barrier to mobile charge carriers flowing through the channel regions 202 between the source terminal and the drain terminal. The gate regions 201 in this embodiment, on the other hand, are predominantly p-type. Therefore, there exists a p-n junction at the boundaries between the gate regions 201 and the channel regions 202 and between the gate regions 201 and the NBL. There is also a p-n junction at the boundary between a gate region 201 and a drain plug 203. The formation of the drain structure will be explained in the next paragraph.

In this embodiment the drain structure includes at least two components. One is the buried layer 115; the other is the drain plug 203. The drain channels a current to and from the channel region 202. It is, therefore, desirable to minimize the its resistance. The resistance of the drain region 203 may be lowered by doping the region heavily. The intrinsic doping concentration of the epi-layer 200, in addition to the n-well implant, is usually not adequate. It takes a dedicated implant step to set the ion concentration in the drain plug region 203 for reaching the desirable resistance level.

The process steps described above is only a portion of the total manufacturing process with which to make an n-type JFET embodying this invention. The other process steps include insulating the junction boundaries between the various regions with dielectric material such as silicon dioxide elements 204 depicted in FIG. 2. FIG. 2 further depicts a portion of the metallic-lead structure associated with the JFET where elements 401 are the first metal level and elements 405 are the first inter-level dielectric material. Not shown in FIG. 2 are such elements as source, drain, and gate contact implant-regions and silicidation region.

The embodiment described above is only by way of illustration. Persons skilled in the art of semiconductor processing and designing would recognize that there are other ways to implement the invention. For example, a p-type JFET may be formed based on the description by reversing the polarity of the materials in the disclosed embodiment. The JFET may be one device component in an integrated circuit comprising other COMS and bipolar components where the manufacturing process must compromise among numerous circuit components, or it may be a discrete device that is manufactured with a dedicated process to optimize its performance.

The invention claimed is:

1. An integrated-circuit device, comprising:
    a substrate, having a top surface and a bottom surface; and
    a vertical JFET, including:
        a first and second pate regions in a first region near the top surface of the substrate, each having a top surface, a bottom surface and a side surface;
        the side surfaces of the first and second gate regions being substantially parallel to each other and substantially perpendicular to the top surface of the substrate;
        the top surface of the first gate region being electrically communicable to a gate terminal;
        a channel region in the first region, between the first and the second gate regions having side surfaces adjacent to the side surfaces of the gate regions, a top surface, and a bottom surface;
        the top surface of the channel region electrically communicable to a source terminal, the bottom surface of the channel region electrically communicable to a drain terminal;
        the gate terminal, the source terminal, and the drain terminal being near the top surface of the substrate;
        the JFET operable to pass an electric current between the source terminal and the drain terminal, the electric current flowing in the channel region in a direction vertical to the top and bottom surfaces of the channel region;
        the first gate region having a pill-box shape with a substantially flat top surface and bottom surface, and a side surface substantially perpendicular to the top and bottom surfaces;
        the channel region having a ring shape enclosing the first gate region, a bottom surface substantially coplanar to the bottom surface of the first gate region and a top surface substantially coplanar to the top surface of the first gate region;
        the second gate region having a ring shape enclosing the channel region, a bottom surface substantially coplanar to the bottom surface of the first gate region and a top surface substantially coplanar to the top surface of the first gate region; and
        a drain plug region having a ring shape enclosing the second gate region, a bottom surface substantially coplanar to the bottom surface of the first gate region and a top surface substantially coplanar to the top surface of the first gate region.

2. The integrated-circuit device in claim 1, in which the electric current passes the channel region upon a biasing voltage being applied between the source terminal and the drain terminal, and the magnitude of the current in the channel region is controllable with a biasing voltage at the gate terminal.

3. The integrated-circuit device in claim 1, in which the substrate is p-type silicon.

4. The integrated-circuit device in claim 1, further comprising an n-type buried layer (NBL).

5. The integrated-circuit device in claim 4, in which the NBL is doped with antimony.

6. The integrated-circuit device in claim 1, in which the first region is formed by an epitaxial growth technique.

7. The integrated-circuit device in claim 6, in which the epi layer is n-type.

8. The integrated-circuit device in claim 1, in which the substrate is a bonded wafer.

9. The integrated-circuit device in claim 1, in which gate-, source-, and drain-contact areas are formed on the top surfaces of the gate-, channel-, and drain-region respectively.

10. The integrated-circuit device in claim 9, in which metal leads are formed connecting a gate contact area to a gate terminal, a source contact to a source terminal, and a drain contact area to a drain terminal.

* * * * *

UNITED STATES PATENT AND TRADEMARK OFFICE
CERTIFICATE OF CORRECTION

PATENT NO.        : 7,164,160 B2                                         Page 1 of 1
APPLICATION NO.   : 10/678028
DATED             : January 16, 2007
INVENTOR(S)       : Sameer P. Pendharkar et al.

It is certified that error appears in the above-identified patent and that said Letters Patent is hereby corrected as shown below:

TITLE PAGE, ITEM (75) INVENTORS:
Correct the first named inventor to: --Sameer P. Pendharkar-- instead of "Sameer P. Pendharker"

Signed and Sealed this

Thirteenth Day of May, 2008

JON W. DUDAS
*Director of the United States Patent and Trademark Office*